United States Patent
Cowles

(10) Patent No.: US 7,167,408 B2
(45) Date of Patent: Jan. 23, 2007

(54) CIRCUITRY FOR A PROGRAMMABLE ELEMENT

(75) Inventor: Timothy B. Cowles, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/177,863

(22) Filed: Jul. 8, 2005

(65) Prior Publication Data

US 2005/0243632 A1     Nov. 3, 2005

Related U.S. Application Data

(60) Continuation of application No. 10/919,770, filed on Aug. 16, 2004, which is a continuation of application No. 10/644,107, filed on Aug. 20, 2003, now Pat. No. 6,801,469, which is a continuation of application No. 10/322,681, filed on Dec. 17, 2002, now Pat. No. 6,674,680, which is a division of application No. 09/954,600, filed on Sep. 11, 2001, now Pat. No. 6,525,982.

(51) Int. Cl.
| | |
|---|---|
| G11C 17/18 | (2006.01) |
| G11C 5/06 | (2006.01) |
| G11C 17/00 | (2006.01) |
| G11C 7/10 | (2006.01) |
| G05F 1/10 | (2006.01) |

(52) U.S. Cl. ................ 365/225.7; 365/63; 365/96; 365/164; 365/189.02; 327/538; 327/541; 327/543

(58) Field of Classification Search ............ 365/225.7, 365/164, 96, 63; 327/538, 540, 541, 543

See application file for complete search history.

(56) References Cited

U.S. PATENT DOCUMENTS

| 5,311,080 A | 5/1994 | Britton et al. ............... 326/40 |
| 5,324,681 A | 6/1994 | Lowrey et al. ............ 438/600 |
| 5,350,710 A | 9/1994 | Hong et al. ................ 438/467 |
| 5,412,244 A | 5/1995 | Hamdy et al. ............. 257/530 |
| 5,424,589 A | 6/1995 | Dobbelaere et al. ......... 326/41 |
| 5,485,105 A | 1/1996 | Harward et al. ............ 326/38 |
| 5,490,042 A | 2/1996 | Perkins ...................... 361/778 |
| 5,504,354 A | 4/1996 | Mohsen ...................... 257/209 |
| 5,525,909 A | 6/1996 | McCollum |
| 5,576,554 A | 11/1996 | Hsu ............................ 257/48 |
| 5,656,949 A | 8/1997 | Yip et al. .................... 326/38 |

(Continued)

Primary Examiner—Amir Zarabian
Assistant Examiner—Ly Duy Pham
(74) Attorney, Agent, or Firm—TraskBritt

(57) ABSTRACT

As part of anti-fuse circuitry for a memory device, a preferred exemplary embodiment of the current invention provides a direct connection between an anti-fuse and a contact pad used to provide voltage to that anti-fuse. The contact pad also serves as a voltage source for at least one other part of the memory device. At least one circuit coupled to the anti-fuse is temporarily isolated from it in the event that a voltage present at the pad would damage the circuit or cause the circuit to improperly read the status of the anti-fuse. The contact pad is available during a probe stage of the in-process memory device, but once the device is packaged, access to that contact pad is prevented. At the backend of the production process, the anti-fuse may be accessed through a second pad, whose electrical communication with the anti-fuse is regulated.

3 Claims, 5 Drawing Sheets

U.S. PATENT DOCUMENTS

| | | | |
|---|---|---|---|
| 5,693,570 A * | 12/1997 | Cernea et al. | 438/107 |
| 5,764,572 A | 6/1998 | Hammick | 365/189.01 |
| 5,774,011 A | 6/1998 | Au et al. | 327/525 |
| 5,790,839 A | 8/1998 | Luk et al. | 713/501 |
| 5,907,517 A | 5/1999 | Komarek et al. | 365/210 |
| 5,936,892 A | 8/1999 | Wendell | 365/189.03 |
| 5,973,978 A | 10/1999 | Cutter et al. | 365/225.7 |
| 6,020,755 A | 2/2000 | Andrews et al. | 326/39 |
| 6,163,475 A * | 12/2000 | Proebsting | 365/63 |
| 6,297,666 B1 | 10/2001 | Weingartner et al. | 326/41 |
| 6,356,498 B1 | 3/2002 | Keeth | 365/226 |
| 6,373,772 B2 | 4/2002 | Kato et al. | |
| 6,396,300 B1 | 5/2002 | Loughmiller et al. | 326/16 |
| 6,411,553 B1 | 6/2002 | Wright et al. | 365/189.05 |
| 6,417,695 B1 | 7/2002 | Duesman | 326/47 |
| 6,466,053 B2 | 10/2002 | Duesman | |
| 6,506,634 B1 | 1/2003 | Kohyama | 438/132 |
| 6,525,982 B1 | 2/2003 | Cowles | 365/225.7 |
| 6,538,949 B2 | 3/2003 | Shore | 365/222 |
| 6,646,912 B2 | 11/2003 | Hurst et al. | |
| 6,750,694 B1 | 6/2004 | Burns et al. | 327/321 |
| 6,750,700 B2 | 6/2004 | Keeth et al. | 327/534 |
| 2001/0030570 A1 | 10/2001 | Kim et al. | 327/525 |
| 2002/0057595 A1 * | 5/2002 | Kobayashi et al. | 365/185.03 |
| 2003/0012071 A1 | 1/2003 | Duesman | |
| 2003/0045026 A1 | 3/2003 | Fogal et al. | 438/107 |
| 2003/0052712 A1 | 3/2003 | Comer et al. | 326/38 |
| 2003/0067817 A1 | 4/2003 | Merrit et al. | 365/200 |

* cited by examiner

CIRCUITRY FOR A PROGRAMMABLE ELEMENT

CROSS-REFERENCE TO RELATED APPLICATIONS

This application is a continuation of U.S. Patent application Ser. No. 10/919,770, filed Aug. 16, 2004, pending, which is a continuation of U.S. Patent application Ser. No. 10/644,107, filed Aug. 20, 2003, which issued as U.S. Pat. No. 6,801,469on Oct. 5, 2004, which is a continuation of U.S. Patent application Ser. No. 10/322,681, filed Dec. 17, 2002, which issued as U.S. Pat. No. 6,674,680 on Jan. 6, 2004, which is a divisional of U.S. Patent application Ser. No. 09/954,600, filed Sep. 11, 2001, which issued as U.S. Pat. No. 6,525,982 on Feb. 25, 2003.

TECHNICAL FIELD

The present invention relates generally to the computer memory field and, more specifically, to methods and circuitry concerning programming elements of memory devices.

BACKGROUND

The fabrication and operation of electronic circuitry on a die often involves allowing for voltages or electronic signals to be received from sources external to the die by way of terminals on the die such as contact pads, electrically conductive areas that are relatively large in relation to a conductive line coupled thereto. The relatively large area of such pads allows them to receive voltages and signals from nodes such as bond wires or probe tips.

Concerning Dynamic Random Access Memory (DRAM) devices, for example, it is often desired to provide a pad that receives a voltage designated as "$DVC_2$." In normal operation, the $DVC_2$ voltage is ideally half of the full voltage (Vcc) under which the memory device operates and which corresponds to a logic "1" value that may be stored in memory. The $DVC_2$ voltage is applied to the DRAM's digit lines, including the main digit lines as well as the complementary digit lines, before reading from or writing to a memory cell.

Writing to a memory cell further involves transmitting at least one command, such as a "write enable" (WE) signal, to the DRAM's control circuitry. It is often desirable to provide a pad configured to receive the WE signal.

Moreover, operation of a DRAM may involve blowing an anti-fuse. Doing so may reroute a signal to or from a device other than the one originally configured to be associated with that signal. For example, in the event a defective memory cell is detected, an appropriate anti-fuse may be blown so that the relevant signals are associated with a redundant cell. Blowing an anti-fuse often involves generating enough of a voltage difference between the opposing plates of a capacitor to break down the dielectric between those plates. For instance, one plate may be coupled to a voltage source, herein referred to as CGND (also known as Vpop), while the other plate may be coupled to ground through a transistor. Thus, when CGND is applied to one plate and the transistor allows the other plate to be grounded for a sufficient time, a short is created between CGND and a node coupled to the other plate. Subsequently, the voltage of CGND is lowered and the transistor isolates the pathway to ground. As with the $DVC_2$ voltage and the WE signal, a pad may be used to provide the CGND voltages. However, to provide yet another pad, one dedicated to this purpose, would require more die space and go against the desire in the industry to use as little space as possible per die in order to fabricate more dice on each silicon wafer. Further, providing such a pad would require more test resources per die, which decreases the ability to test in parallel and increases test time and cost. As a result, a pad that serves another function may be chosen to transmit the CGND voltage as well. Which pad is chosen depends on several factors.

Two factors to be considered in choosing the pad for CGND involve the notions that (1) blowing anti-fuses may be desired at several stages in the process of fabricating a memory device; and (2) some contact pads may not be available later in the process. The pad receiving $DVC_2$, for example, is accessible for anti-fuse blowing that may occur during a production stage known as "probe." At that stage, testing an unpackaged die may occur by applying voltages directly to the die's pads using conductive pins from a test device. However, at some point after probe, the die is packaged. As a non-limiting example of packaging, some of the contact pads may be bonded to wires leading to conductive fingers of a lead frame. The die is then encapsulated with a protective material, with the far ends of the fingers projecting from the encapsulant. Some of the contact pads, however, may not be bonded to wires and are therefore inaccessible after packaging. Nevertheless, additional testing, repairing, or reconfiguring of the die may be desirable at this stage, known as "backend." The $DVC_2$ pad is a contact pad that is not bonded to a wire and is therefore inaccessible after packaging. As a result, one of ordinary skill in the art is encouraged to choose another pad to provide CGND.

A pad receiving the WE signal may be available during both probe and backend; but if a pad is accessible by a tester at backend in testing/reconfiguration modes, it may also be accessible by a post-production user during non-test/non-reconfiguration/standard operation modes. Because it is not desirable to allow such a user to affect CGND, the conductive path from the write pad to the anti-fuse must be regulated, such as with a transistor. However, in order to ensure that sufficient voltage passes through the transistor during an anti-fuse blowing mode at backend, self-booting circuitry is included. As discussed in greater detail below, such circuitry is not foolproof, and additional delays may be introduced into the anti-fuse blowing process.

As a result, there is a need in the art to address the time, methods and circuitry of blowing an anti-fuse.

SUMMARY OF THE INVENTION

Accordingly, exemplary embodiments of the current invention concern a direct connection between a die's anti-fuse and a die terminal configured to receive an external voltage. In a preferred embodiment, the terminal is also configured to provide voltage to another device. When a voltage is being supplied to that other device, and that voltage would affect the ability of circuitry to properly determine the status of the anti-fuse, preferred embodiments of the current invention isolate the anti-fuse from such circuitry. In a more preferred embodiment, access to the terminal is eventually prevented, but access to the anti-fuse by way of a still-accessible second terminal is allowed, wherein the connection between the anti-fuse and the second terminal is regulated.

DETAILED DESCRIPTION OF THE INVENTION

Figure 1:
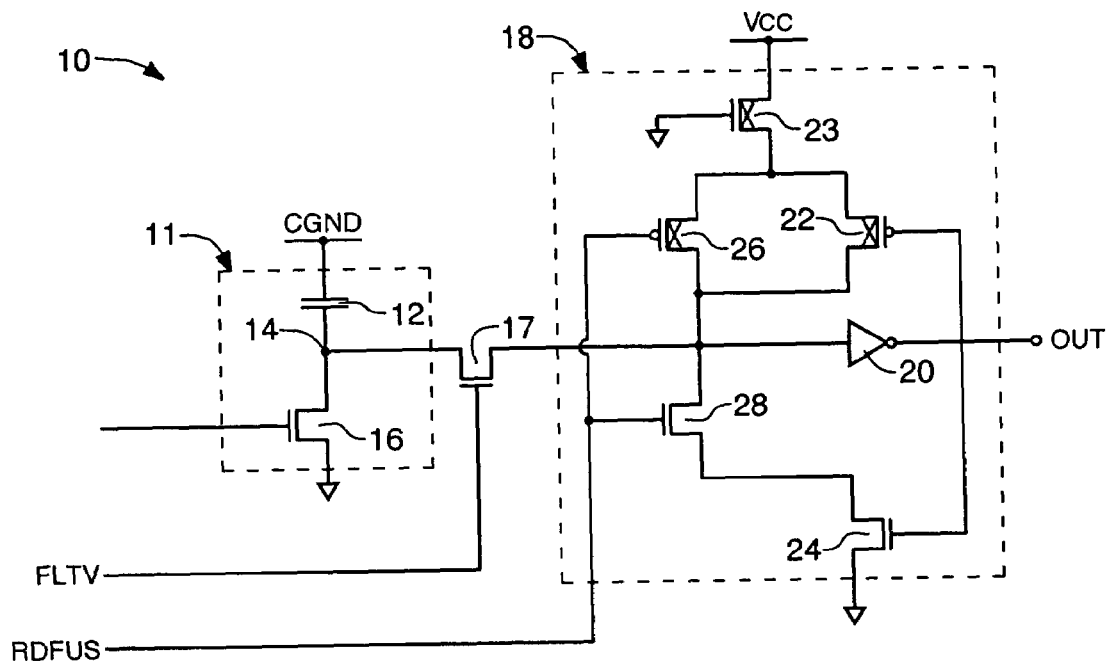
FIG. 1 depicts an anti-fuse circuit and a latch circuit known in the prior art.

FIG. 1 shows prior art circuitry 10 comprising an anti-fuse circuit 11 and a latch circuit 18. The anti-fuse circuit 11 comprises a capacitor, the anti-fuse 12, wherein one plate of the capacitor is configured to couple to a voltage source CGND and the other is configured to couple to ground through node 14 and a transistor 16. Before blowing, the dielectric between the plates of anti-fuse 12 is intact, thereby electrically isolating node 14 from CGND. In a non-limiting example of blowing the anti-fuse, CGND is established to be ten volts and the gate of transistor 16 is driven for at least 2 milliseconds. As a result, the dielectric between the plates of anti-fuse 12 breaks down, and a conductive path from CGND to node 14 is established. Subsequently, the voltage of CGND is lowered, preferably to less than Vcc.

While CGND is high, however, there is a risk of damaging the latch circuit 18. In order to prevent such damage, a voltage regulation transistor 17 is electrically interposed between the anti-fuse circuit 11 and the latch circuit 18. In the prior art, this voltage regulation transistor 17 is turned off only during the anti-fuse blowing mode. Any other time, a voltage that is slightly less than Vcc is applied to the gate of voltage regulation transistor 17 by way of signal FLTV (Fuse Latch Transistor Voltage). For instance, 200 millivolts less than Vcc may be applied. As a result, the maximum voltage that could be applied from the anti-fuse circuit 11 to the source of voltage regulation transistor 17 is Vcc minus 200 millivolts and minus the threshold voltage of voltage regulation transistor 17. Such a voltage provides enough electrical communication for reading the state of the anti-fuse 12 using latch circuit 18 while protecting it from excess voltages. Prior artisans are taught to maintain this sub-Vcc voltage to the gate of voltage regulation transistor 17 at all times other than during an anti-fuse-blowing mode. This is due at least in part to the fact that prior art already provides other protection circuitry between the pad receiving the voltage and the CGND node (such as the pass gate 42 described below) that is to be used in times other than the anti-fuse-blowing mode. Thus, to shut off regulation transistor 17 outside of that mode would result in unnecessary redundancy.

As mentioned above, latch circuit 18 is used to determine the state of the anti-fuse 12. An example of such circuitry includes an inverter 20 with an input coupled to node 14 (through voltage regulation transistor 17) and an output node OUT that drives a p-channel transistor 22 and an n-channel transistor 24. The p-channel transistor 22 has a source coupled to Vcc (assumed to be 3 volts) through a current-limiting p-channel transistor 23. The drain of p-channel transistor 22 is coupled to the input of inverter 20. The n-channel transistor 24 has a source coupled to ground. A second p-channel transistor 26 has its source coupled to Vcc (through p-channel transistor 23) and its drain coupled to the input of inverter 20. A second n-channel transistor 28 has its drain coupled to the input of inverter 20 and its source coupled to the drain of n-channel transistor 24. The gates of second n-channel transistor 28 and second p-channel transistor 26 are coupled and driven by a signal RDFUS that is transmitted when one desires to read whether the anti-fuse has been blown.

The results of such reading depend on whether the anti-fuse 12 is blown and whether CGND represents a low enough voltage. In any case, the status of the anti-fuse 12 is read when RDFUS represents a low voltage or "logic 0" signal. Such a signal turns on the second p-channel transistor 26 and turns off the second n-channel transistor 28. As a result, the transistors 26 and 28 in this state attempt to raise the voltage of node 14 and the input of the inverter 20 to Vcc. If the anti-fuse 12 is unblown, node 14 is isolated from the low CGND voltage (and it is assumed that transistor 16 is off as well). Because the input of inverter 20 has a high voltage, its output OUT is a low voltage or "logic 0" signal, which represents the fact that the anti-fuse is unblown. If the anti-fuse is blown, however, then there is a path from node 14 and the input of inverter 20 to a voltage lower than Vcc (CGND). The resulting discharge results in a low voltage or logic 0 signal input to inverter 20. Accordingly, the output OUT of inverter 20 is a high voltage or logic 1 signal, which represents the fact that the anti-fuse is blown. This second example assumes that CGND is low enough below Vcc such that a logic 0 is recognized at the input of inverter 20. Typically, CGND is held at ground during modes that do not involve blowing an anti-fuse. However, if for some reason CGND is not low enough, the input of inverter 20 may not sufficiently discharge through the anti-fuse 12. As a result, a logic 1 may be recognized at the input of inverter 20, and the output OUT will be a logic 0, signifying an unblown anti-fuse when in fact the anti-fuse is blown.

Even if the low voltage RDFUS command is not given, the output node OUT will still reflect the status of the anti-fuse 12, and the latch circuit 18 may suffer the same problem discussed above if the CGND is too high at the wrong time. If RDFUS has a high voltage representing a "logic 1," the second p-channel transistor 26 is turned off and the second n-channel transistor 28 is turned on. If the anti-fuse 12 is blown, the input to inverter 20 should have a low voltage. As a result, the output node OUT will have a high voltage that turns off p-channel transistor 22 and turns on n-channel transistor 24. Thus, the input of inverter 20 will be isolated from Vcc and grounded, thereby maintaining the high voltage signal at OUT, which signifies a blown anti-fuse. However, if the anti-fuse is blown but CGND is too high, then there is a risk that the input node of inverter 20 may have a high enough voltage for long enough to result in a low voltage signal at the output node OUT. When that voltage is applied to the gates of transistors 22 and 24, it isolates the input of inverter 20 from ground and allows the Vcc source to electrically communicate with the input of inverter 20, thereby maintaining a low voltage signal at OUT, which incorrectly signifies an unblown anti-fuse.

Figure 2:
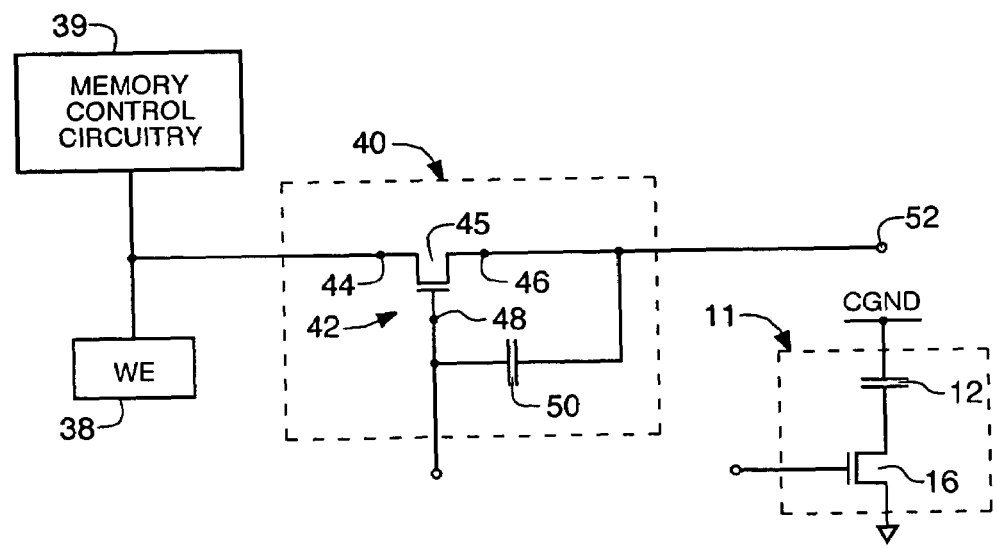
FIG. 2 depicts an anti-fuse circuit and related circuitry known in the prior art.

Thus, regardless of the state of RDFUS, if for some reason CGND is not low enough, the latch circuit 18 may indicate that the anti-fuse 12 is unblown when in fact it is blown. This could reverse the effect of any changes that the blown anti-fuse 12 is supposed to govern. One reason that CGND may not be low enough is if the contact pad used to carry the CGND voltage serves another function involving increased voltages. Although using one contact pad for multiple functions may create the potential for certain problems to arise, one of ordinary skill in the art is nevertheless encouraged to share such resources in order to conserve die space. For reasons discussed in the Background section, one of ordinary skill is further encouraged to share the CGND function with a pad that can be accessed at backend as well as probe, such as the WE pad 38 depicted in FIG. 2. FIG. 2 shows that, in addition to transmitting the CGND voltage to anti-fuse 12, the WE pad 38 is coupled to memory control circuitry 39. It should be noted, however, that the WE pad 38 is not directly connected to the anti-fuse 12. Rather, any signal from the WE pad 38 must first pass through the drain 44, channel 45, and source 46 of a transistor identified as a pass gate 42, which is part of a larger self-booting pass gate circuit 40.

Such regulation of the signal stems from another issue raised by the fact that the WE pad may be accessed after packaging. Specifically, if a tester can transmit a high voltage during testing through a lead finger, bond wire, and pad 38 to CGND node 52, so too can a customer/end-user transmit a high voltage to that same destination during non-anti-fuse-blowing modes of operation. As described above, the result could be that the voltage output from the anti-fuse circuit 11 would indicate that the anti-fuse is unblown when, in fact, it has been blown. This may reconfigure the die's circuitry and interfere with its operation. As a result, pass gate 42 is provided and is turned off during non-fuse-blowing modes of operation in order to prevent electrical communication between pad 38 and the CGND node 52.

Only when an anti-fuse-blowing mode is desired is the gate 48 of pass gate 42 driven. Further, the voltage required for such a mode encourages the use of capacitor 50 as illustrated in FIG. 2. Capacitor 50 is coupled to both the source 46 and gate 48 of the pass gate 42. When the time comes to blow an anti-fuse, prior art teaches providing ten volts at the CGND node 52 using the WE pad 38. Thus, ten volts is applied to the WE pad 38, and the pass gate circuitry ideally operates to transmit that voltage to the CGND node 52 in the manner described below.

Figure 3:
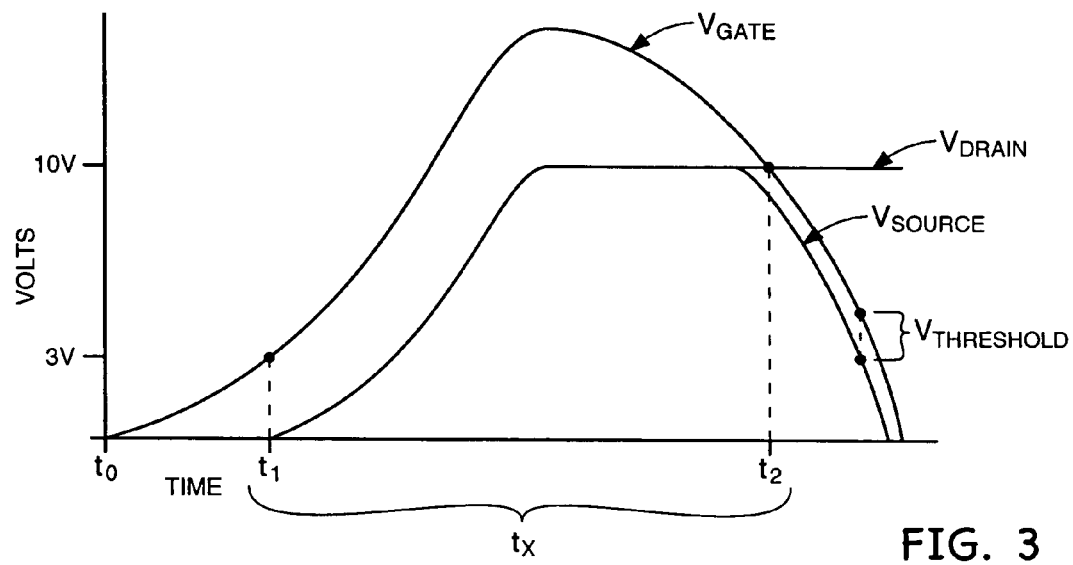
FIG. 3 depicts the voltages at various nodes of a regulation transistor known in the prior art.

Regardless of the voltage applied to drain 44, the maximum voltage that can be generated at the source 46 is equal to the voltage applied to the gate 48 minus the threshold voltage of pass gate 42. Hence, it is desired to apply a voltage to gate 48 that is high enough above the voltage applied to the drain 44 so that the drain 44 voltage may generate the same voltage at the source 46. Thus, before the anti-fuse blowing process begins, the drain 44, gate 48, and source 46 are at zero volts, as illustrated in FIG. 3 at time $t_0$. In anticipation of the anti-fuse blowing process, three volts are applied to gate 48 before a voltage is applied to the drain 44 at time $t_1$. At that time $t_1$, the voltage of the drain 44 is gradually raised from zero volts. When the drain 44 reaches one volt, the gate (already at three volts) allows that one volt to be applied to the source 46. Given the configuration of the pass gate circuitry, that one volt is also applied to the capacitor 50 which, in turn, causes the voltage at the gate 48 to increase to four volts. As a result, at a time within the range $t_x$, the gate 48 voltage stays higher than the drain 44 voltage, and the full voltage at the drain 44 is applied to the source 46 and the CGND node 52.

Figure 4:
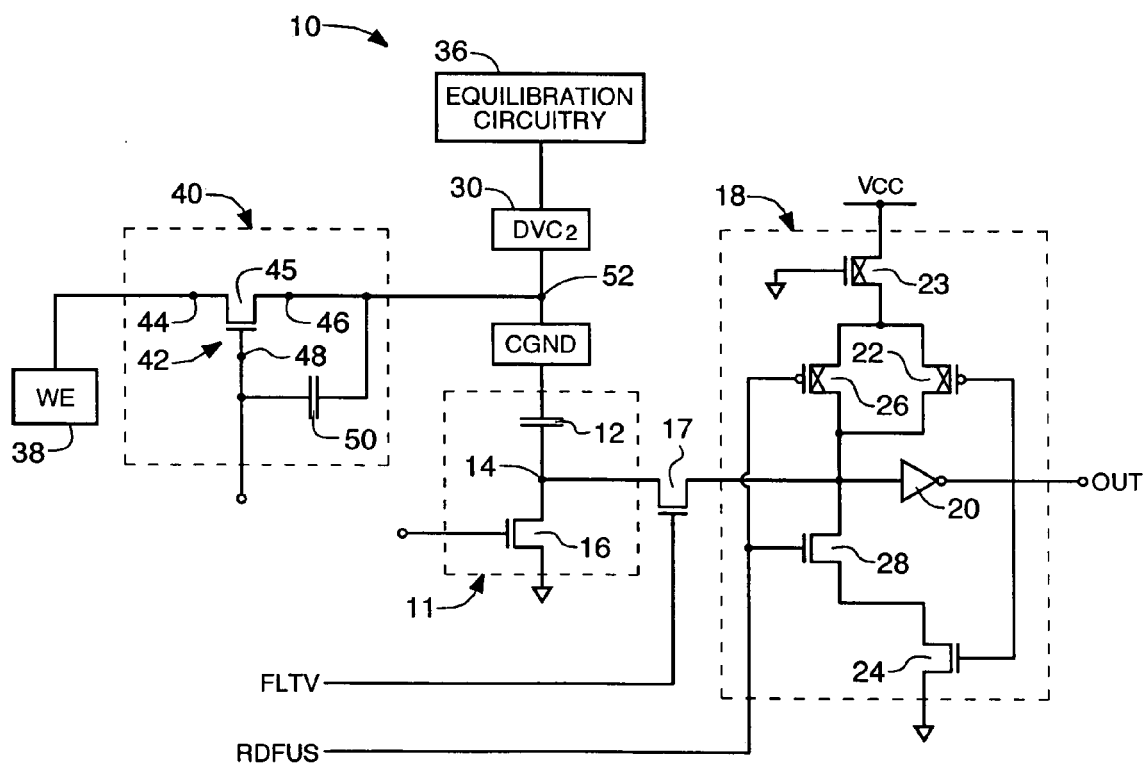
FIG. 4 depicts an exemplary embodiment of the current invention.

The paragraph above describes the ideal operation of the pass gate circuitry 40. In reality, however, the capacitor 50 leaks charge. As a result, the ability of the capacitor to keep the gate 48 voltage above the drain 44 voltage decreases over time. Eventually, the gate 48 voltage is lower than the drain 44 voltage, as depicted in FIG. 4 after time $t_2$. Even before $t_2$, the source 46 voltage begins to lower, as its maximum may only be $V_{gate}$-$V_{threshold}$. Thus, at some point, the voltage at the source 46 is not sufficient for a reliable anti-fuse blow. In addition, it should be appreciated that the CGND node 52 may be coupled to more than one anti-fuse 12 and that blowing multiple anti-fuses in parallel further lowers the source 46 voltage. In practice, the source 46 voltage is sufficient for blowing ten anti-fuses in series. Additional blows will be increasingly uncertain. As a result, after ten anti-fuse blows in series, prior art teaches carrying out a "boot-up" process, wherein the drain 44, gate 48, and source 46 are grounded; and the voltages are increased again as described in the above paragraph,. During probe, this boot-up process represents about 20% of the test time it takes to blow all fuses and repair.

Figure 5:
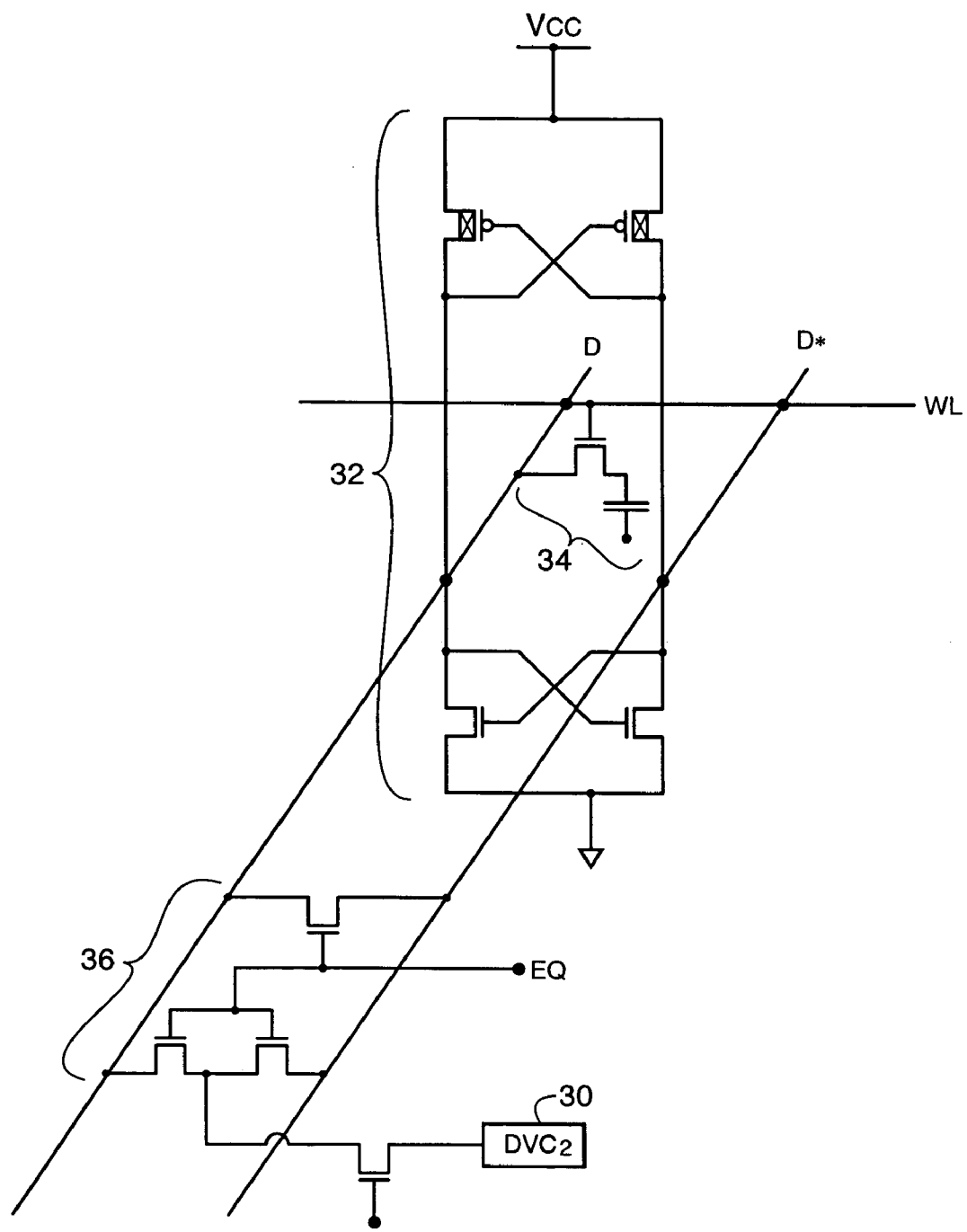
FIG. 5 depicts memory circuitry known in the prior art.

At least one exemplary embodiment of the current invention addresses this problem by providing a direct connection between a contact pad and the CGND node 52, as seen in FIG. 4. Illustrated therein is an electrically continuous conductive line leading from contact pad 30 to the anti-fuse 12. In this exemplary embodiment, the contact pad 30 is also used to transmit a voltage $DVC_2$ for the benefit of equilibration circuitry 36. FIG. 5 illustrates the equilibration circuitry 36. Equilibration circuitry 36 will short digit lines D and D* in response to a signal EQ. In further response to signal EQ, a voltage of $DVC_2$ is established at both D and D*, which is encouraged before attempting to read from or write to memory cell 34. In normal operations, $DVC_2$ is half of Vcc. During certain test modes, however, $DVC_2$ may be higher in order to test the margin of a sense amp 32. The contact pad 30 is used to initially provide the $DVC_2$ voltage for equilibration circuitry 36; thereafter, the $DVC_2$ voltage is generated internally and the contact pad 30 is isolated from equilibration circuitry 36 unless it is needed to provide a different voltage for that circuitry 36, such as for margin testing.

Such differing voltages are one factor that discourages one of ordinary skill in the art from using such a pad for CGND. As mentioned above, a high voltage at CGND in the prior art risks having the latch circuit 18 mistakenly indicate that a blown anti-fuse is unblown. At least one exemplary embodiment of the current invention addresses this issue by countering another teaching in the art. Specifically, such an embodiment proposes turning off regulation transistor 17 during at least one mode other than the one in which anti-fuses are blown, preferably including the testing mode in which $DVC_2$ is raised. Thus, although node 14 may reflect a logic 1 value in the event anti-fuse 12 is blown and CGND is high enough, the lack of drive to the gate of transistor 17 prevents that value from being input to inverter 20 and signifying an unblown anti-fuse at the output node OUT.

Another factor that would discourage one of ordinary skill in the art from using a contact pad such as the $DVC_2$ pad 30 is that, sometime after probe and before backend, access to the $DVC_2$ pad 30 by external devices is denied. Specifically, the die undergoes the packaging process without a wire being bonded to that pad 30. Moreover, access to the FLTV signal is denied as well. Accordingly, it is preferred under at least some of the exemplary embodiments of the current invention to maintain the regulated connection between CGND node 52 and the WE pad 38. A great benefit is still realized under exemplary embodiments of this type, as it has been found that only one or two anti-fuses per die are blown at backend, whereas probe generally involves blowing two to ten thousand anti-fuses per die, and this number should increase as density increases in terms of devices per unit area of the die. Thus, with the direct connection eliminating the need for a self-booting pass gate circuit and the problems related to it, the 20% of anti-fuse blowing time devoted to reboot at probe is saved.

Exemplary embodiments of this type also allow for blowing several anti-fuses in parallel without comprising the voltage of CGND. In fact, given the direct connection to CGND, the only limitation on the voltage of CGND is the current supply from the tester.

Figure 6:
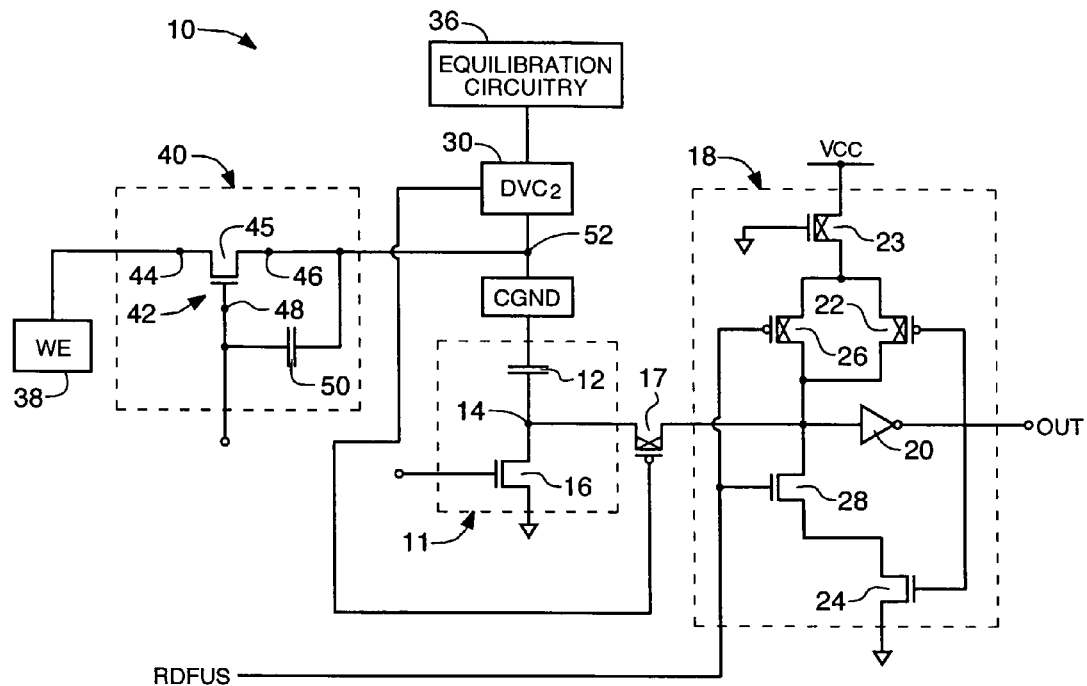
FIG. 6 depicts another exemplary embodiment of the current invention.
Figure 7:
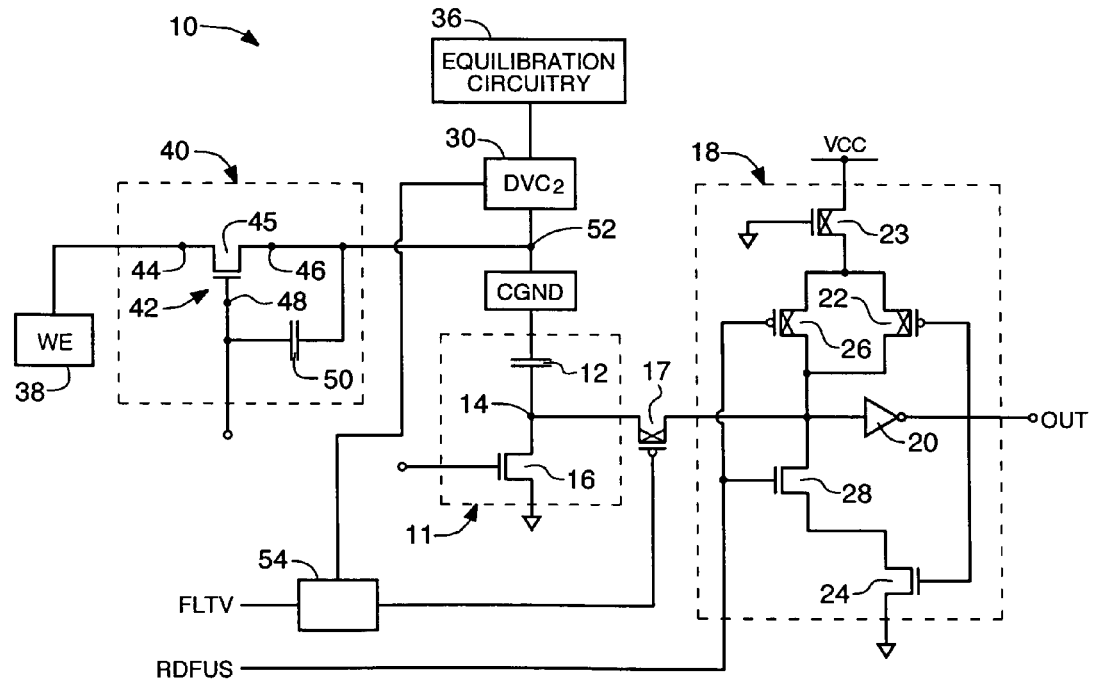
FIG. 7 depicts yet another exemplary embodiment of the current invention.

It should be noted that in the exemplary embodiments described above, the regulation transistor 17 is illustrated as an n-channel transistor. However, this particular type of transistor is not relevant to all embodiments. In fact, providing a p-channel transistor for regulation transistor 17 offers certain benefits. As shown in the exemplary embodiment of FIG. 6, a p-channel regulation transistor 17 may be driven by the same $DVC_2$ pad 30 used to provide CGND to node 52. When the voltage of the $DVC_2$ pad 30 is at ground, regulation transistor 17 is turned on, and the latch circuit 18 may determine the status of the anti-fuse 12. Should the voltage of $DVC_2$ pad 30 increase, either due to margin testing, an anti-fuse blowing mode, or another reason, that voltage will serve to further turn off the regulation transistor 17, thereby further protecting the latch circuit 18 from that very voltage. In yet another embodiment seen in FIG. 7, FLTV may still be used to drive regulation transistor 17 (provided the logic generating that signal is configured to accommodate a p-channel transistor rather than an n-channel transistor), and a multiplexer 54 is used to switch between the two inputs.

Figure 8:
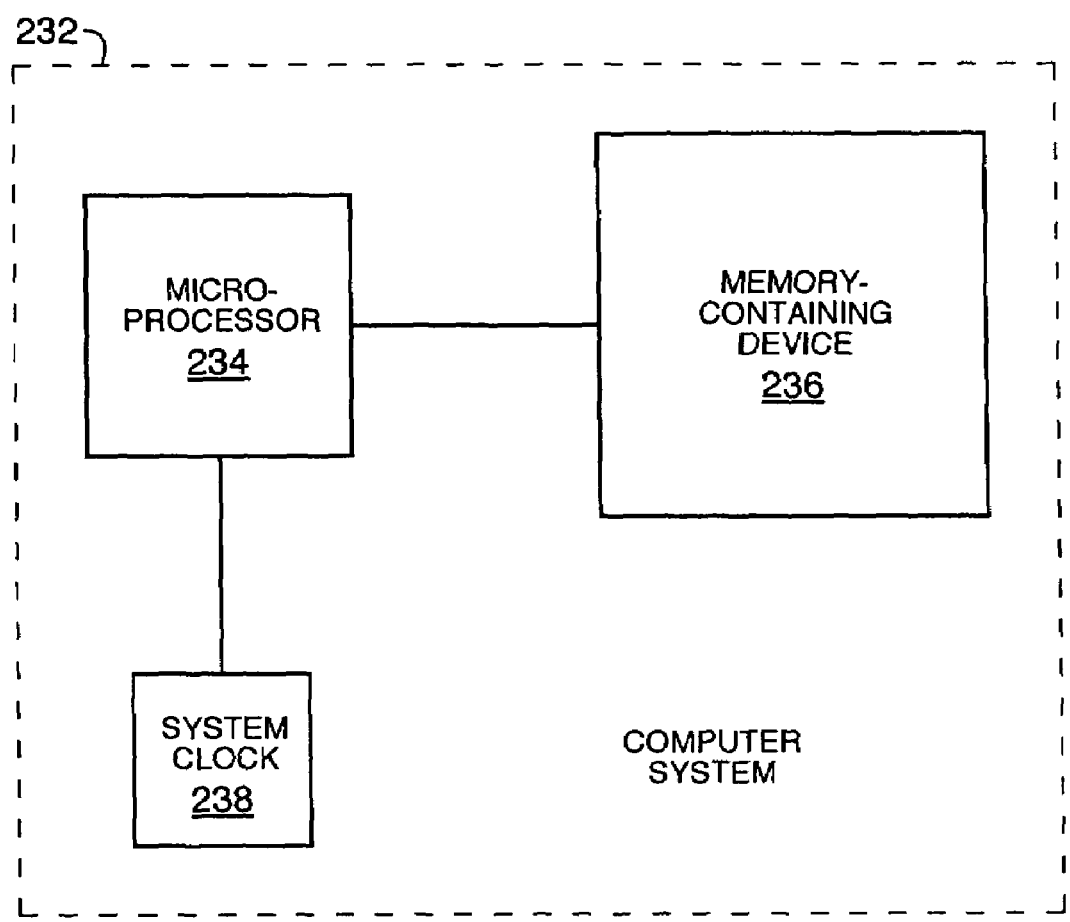
FIG. 8 depicts still another exemplary embodiment of the current invention.

Further, exemplary embodiments of the current invention may be used to accommodate systems using memory, wherein the memory may include nonvolatile, static, or dynamic memory, and wherein the memory may be a discrete device, embedded in a chip with logic, or combined with other components to form a system on a chip. Further, such configurations represent exemplary embodiments of the current invention themselves. For example, the embodiment in FIG. 8 illustrates a computer system 232, wherein a microprocessor 234 transmits address, data, and control signals to a memory-containing device 236 such as one including, but not limited to, those described above. A system clock circuit 238 provides timing signals for the microprocessor 234.

One skilled in the art can appreciate that, although specific embodiments of this invention have been described above for purposes of illustration, various modifications may be made without departing from the spirit and scope of the invention. For example, while exemplary embodiments addressed above address directly connecting the CGND node 52 to a contact pad 30 will not receive a wire bond by the end of the die packaging process, the current invention includes within its scope exemplary embodiments that do not involve any wire bonding of the die. For instance, at least one exemplary embodiment concerns communicating with at most some of the die's bond pads using a ball grid array (BGA), wherein traces leading from the balls to the pads avoid at least one contact pad that may be used to provide a high CGND voltage for blowing an anti-fuse at probe. Moreover, $DVC_2$ is not the only pad that may be used to provide the CGND voltage. For instance, at the time of filing this application, Micron Technology is experimenting with a part that transfers data at a Double Data Rate (DDR), both on the rising and falling edges of a clock pulse. This part uses a pad designated as "QFC" to provide high CGND voltage for blowing an anti-fuse. Alternatively, any pad designated as a "no connect" pad could be used. Moreover, the current invention is not limited in scope to methods and circuitry involving anti-fuses. Rather, fuses and other programmable elements are included within the scope as well. Moreover, the current invention includes embodiments involving any circuit device wherein a first voltage is used in a first mode of that device and a second voltage is used in a second mode of that device, and the first and second voltages are provided to the die at a shared terminal. Accordingly, the invention is not limited except as stated in the claims.

What is claimed is:

1. A voltage regulation circuit for a programmable element configured to receive a voltage from a node, and a latch circuit configured to read a state of the programmable element, the voltage regulation circuit comprising:
   a transistor configured to couple to the latch circuit; and
   a first conductive path coupled to the transistor, wherein the first conductive path extends to the node and is interrupted only by the programmable element.

2. The circuit in claim 1, wherein the transistor is an n-channel transistor.

3. The circuit in claim 1, wherein the transistor is a p-channel transistor.

* * * * *

UNITED STATES PATENT AND TRADEMARK OFFICE
CERTIFICATE OF CORRECTION

| | | |
|---|---|---|
| PATENT NO. | : 7,167,408 B2 | Page 1 of 1 |
| APPLICATION NO. | : 11/177863 | |
| DATED | : January 23, 2007 | |
| INVENTOR(S) | : Cowles | |

It is certified that error appears in the above-identified patent and that said Letters Patent is hereby corrected as shown below:

In column 8, line 39, in Claim 1, after "to" insert -- a source of --.

In column 8, line 39, in Claim 1, after "circuit;" delete "and".

In column 8, line 42, in Claim 1, after "element" delete "." and insert -- ; a second conductive path coupled to a gate of the transistor and extending to the node; and a multiplexing circuit configured to receive an input, wherein the second conductive path is interrupted by the multiplexing unit. --, therefor.

Signed and Sealed this

Fifteenth Day of April, 2008

JON W. DUDAS
*Director of the United States Patent and Trademark Office*